United States Patent
Hashii et al.

(10) Patent No.: US 6,753,256 B2
(45) Date of Patent: Jun. 22, 2004

(54) METHOD OF MANUFACTURING SEMICONDUCTOR WAFER

(75) Inventors: Tomohiro Hashii, Osaka (JP); Tooru Watanabe, Osaka (JP)

(73) Assignee: Sumitomo Metal Industries, Ltd., Osaka (JP)

(*) Notice: Subject to any disclaimer, the term of this patent is extended or adjusted under 35 U.S.C. 154(b) by 0 days.

(21) Appl. No.: 09/919,900

(22) Filed: Aug. 2, 2001

(65) Prior Publication Data

US 2002/0016072 A1 Feb. 7, 2002

(30) Foreign Application Priority Data

Aug. 3, 2000 (JP) .................. 2000-235146
Jul. 30, 2001 (JP) .................. 2001-229118

(51) Int. Cl.[7] .......................... H01L 21/302

(52) U.S. Cl. .............. 438/689; 438/690; 438/691; 438/692; 438/703; 438/705

(58) Field of Search ............... 438/689, 690, 438/703, 705, 795, 691, 753, 692, 706, 693, 799, 471, 745, 460, 928, 974, 906, 959, 964, 977

(56) References Cited

U.S. PATENT DOCUMENTS 6,066,565 A * 5/2000 Kuroki et al. ............... 438/692
6,114,245 A * 9/2000 Vandamme et al. ......... 438/690
6,227,944 B1 * 5/2001 Xin et al. ..................... 451/41
6,358,117 B1 * 3/2002 Kato et al. ..................... 451/8

FOREIGN PATENT DOCUMENTS

JP          409246216 A * 9/1997 ......... H01L/21/304

* cited by examiner

Primary Examiner—Matthew Smith
Assistant Examiner—Igwe U. Anya
(74) Attorney, Agent, or Firm—Breiner & Breiner, L.L.C.

(57) ABSTRACT

An object of the present invention is to provide a method of manufacturing a semiconductor wafer in which the manufacturing efficiency of grinding using a double-headed grinding machine is improved, minute surface undulations arising through the grinding are reduced, and the yield of the manufacturing process is improved. By processing a sliced wafer using a double-headed grinding machine, a strained layer and a macroscopic undulation component formed on the wafer surfaces during the slicing are removed, and the degree of flatness of the wafer is improved, and by subsequently carrying out both-surfaces lapping, minute surface undulations that arose during the double-headed grinding are removed.

1 Claim, 5 Drawing Sheets

METHOD OF MANUFACTURING SEMICONDUCTOR WAFER

BACKGROUND OF THE INVENTION

1. Field of the Invention

The present invention relates to a method of obtaining a semiconductor wafer having a high degree of flatness and little processing-induced strain from a monocrystalline ingot, in particular a method of manufacturing a semiconductor wafer in which an improvement in manufacturing efficiency is achieved by grinding with a double-headed grinding machine, and moreover minute surface undulations produced by the grinding are reduced and hence a more uniform surface is obtained.

2. Description of the Related Art

The following steps are generally used in a method of manufacturing a semiconductor wafer: 1) a slicing step of slicing a monocrystalline ingot pulled using a monocrystal pulling device to obtain a thin disk-shaped wafer; 2) a chamfering step of chamfering the sliced wafer to prevent chipping or cracking; 3) a lapping step to flatten the chamfered wafer; 4) an etching step to remove a processing-induced strained layer that appears on the wafer as a result of the aforementioned processing; 5) a polishing step of finish-polishing the chamfered part; 6) a polishing step of polishing either one or both surfaces of the wafer; and 7) a finish-polishing step of finish-polishing the wafer.

For the purpose of reducing the number of manufacturing steps or the amount of polishing and improving the flatness of the wafer produced, a method in which chamfering is carried out after slicing, then planar grinding of both surfaces is carried out, and then finishing is carried out by chemical polishing (Japanese Patent Application Laid-open No. H8-31680) and a method in which planar grinding of both surfaces is carried out after slicing, then etching to remove residual strain is carried out if necessary, and then both surfaces are finished by chemical polishing (Japanese Patent Application Laid-open No. H9-248740), have been proposed.

Moreover, for the purpose of simplifying the manufacturing process and improving the flatness, a method in which chamfering is carried out after slicing, then planar grinding of one surface is carried out, then etching to remove residual strain is carried out if necessary, then washing is carried out, and then both surfaces are finished by chemical polishing (Japanese Patent Application Laid-open Nos. H9-260314, H9-270396), and a method in which chamfering is carried out after slicing, then planar grinding of one surface and lapping are carried out, then dry etching is carried out, and then both surfaces are finished by chemical polishing (Japanese Patent Application Laid-open No. 9-260314), have been proposed.

Various problems have come to the fore with lapping devices used in conventional manufacturing processes. For example, as the diameter of wafers increases, the lapping device must be made larger, and the costs of consumable materials and the device increase; as the diameter of wafers increases and the lapping devices become larger, the load on workers increases; as the amount of consumable materials required increases, the amount of industrial waste (waste polishing dust) increases. Moreover, if one-surface grinding is carried out immediately after slicing, then the undulations caused by the wire saw cannot be removed.

A means by which the above-mentioned problems relating to the lapping device can be resolved is to follow one of the various proposals described above in which a double-headed grinding machine is used in place of the lapping device.

However, if a wafer is manufactured using a double-headed grinding machine, then minute surface undulations (height of a few tens of nm, period of a few mm) appear on the surfaces of the wafer due to the double-headed grinding step.

SUMMARY OF THE INVENTION

An object of the present invention is to provide a method of manufacturing a semiconductor wafer in which manufacturing efficiency is improved by grinding using a double-headed grinding machine, and minute surface undulations arising through the grinding are reduced, allowing more uniform surfaces to be obtained.

The present inventors conducted various studies for the purpose of adopting a double-headed grinding step and also combining this step with a step for removing minute surface undulations arising through the double-headed grinding. As a result, the present inventors arrived at the present invention upon discovering that, by processing a wafer after slicing using a double-headed grinding machine, a strained layer and a macroscopic undulation component formed on the wafer surfaces during slicing are removed, and the degree of flatness of the wafer is improved, and that by subsequently carrying out both-surfaces lapping, minute surface undulations that arise during the double-headed grinding are removed.

The present invention thus provides a method of manufacturing a semiconductor wafer comprising a double-headed grinding step, a both-surfaces lapping step, and a both-surfaces polishing step in that order.

Moreover, the present inventors also propose methods of manufacturing a semiconductor wafer in which, in the above-mentioned method, a periphery chamfering step is used after the double-headed grinding step, the both-surfaces lapping step is carried out using elastic platen, and/or a chemical etching step or a grinding step using a single side grinding machine of inversion type optionally followed by an alkali etching step is used after the both-surfaces lapping step.

According to the present invention, when obtaining a semiconductor wafer from a monocrystalline ingot, by carrying out lapping after double-headed grinding, a high-precision semiconductor wafer having no minute undulations (height of 10 to 100 nm, period of 1 to 10 mm) can be manufactured with the amount of waste polishing slurry discharged in the lapping step being reduced to about one quarter.

The present invention relates to obtaining, from a monocrystalline ingot, a semiconductor wafer having a high degree of flatness and little processing-induced strain; by carrying out lapping after double-headed grinding, a high-precision semiconductor wafer having both surfaces polished and having no minute surface undulations can be obtained, the amounts of consumable materials used can be reduced, and manufacturing can be carried out efficiently.

DESCRIPTION OF THE PREFERRED EMBODIMENTS

Figure 1:
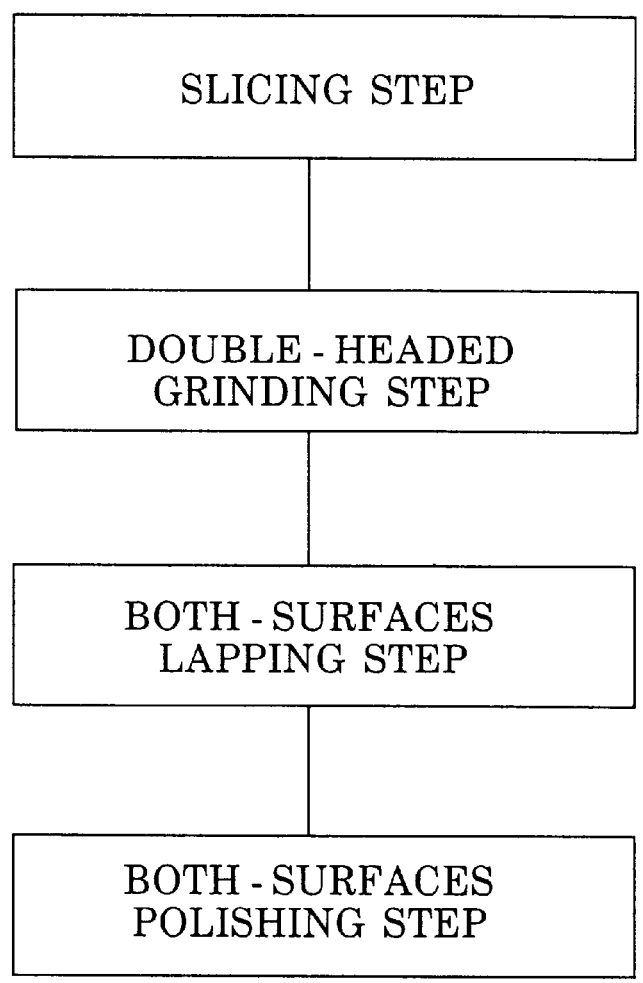
FIG. 1 is a flowchart showing processing steps used in Embodiment 1.
Figure 2:
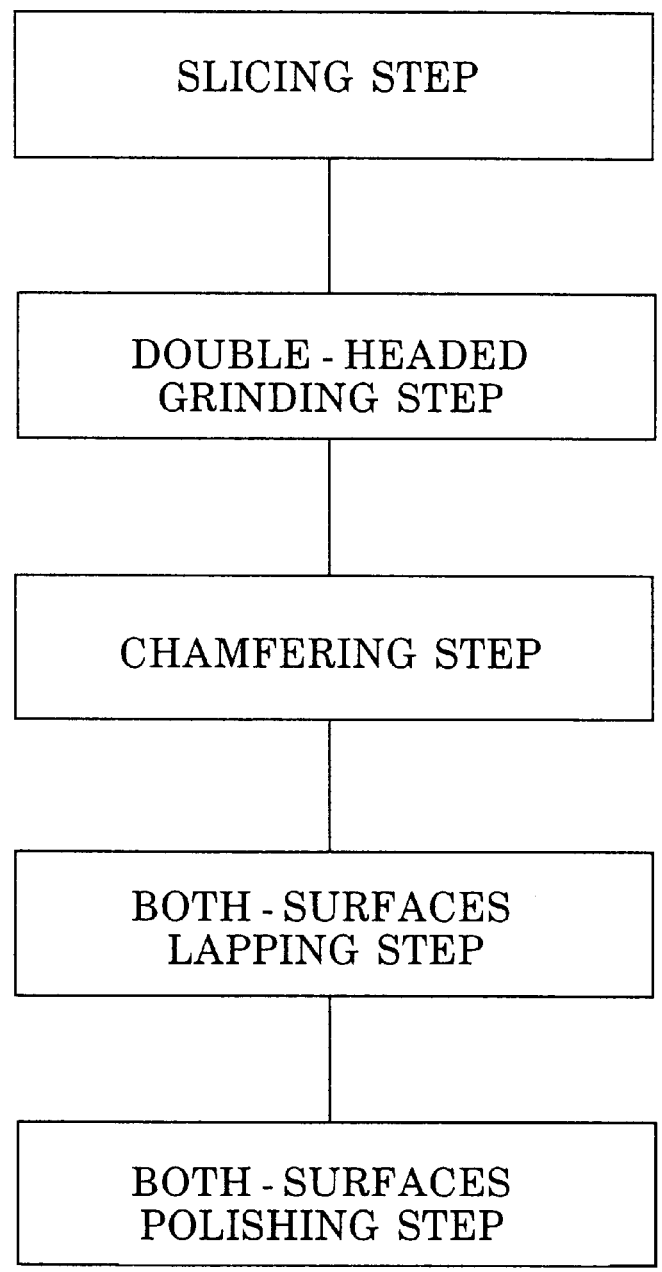
FIG. 2 is a flowchart showing processing steps used in Embodiment 2.
Figure 3:
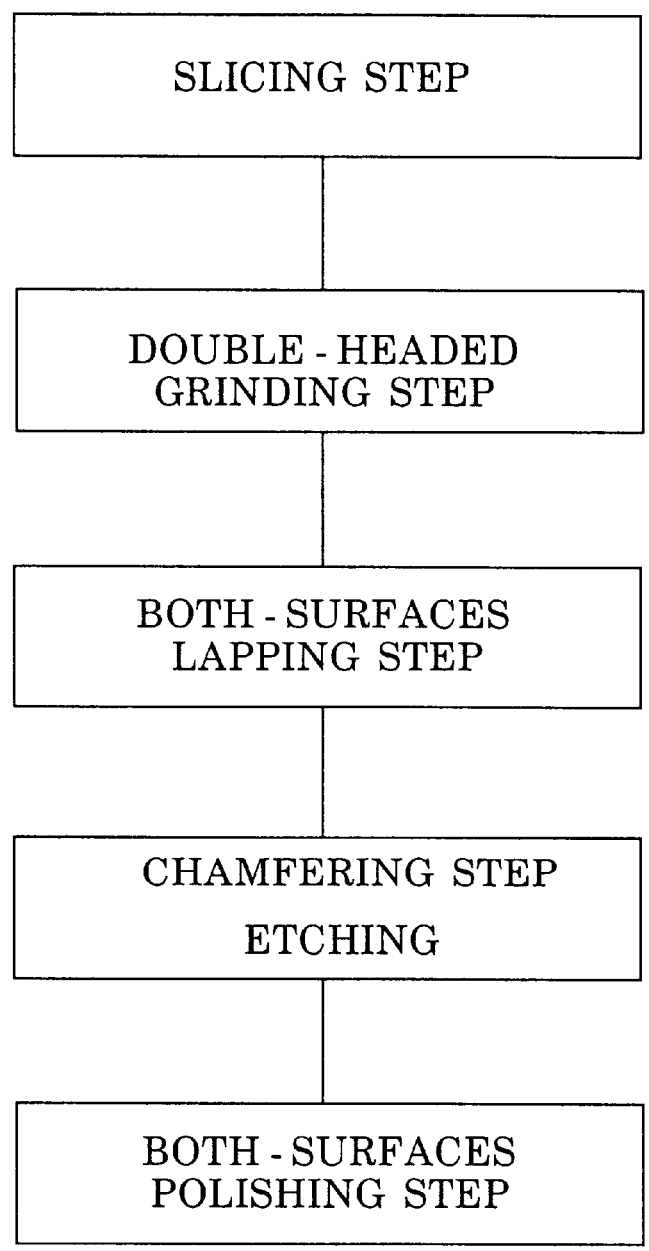
FIG. 3 is a flowchart showing processing steps used in Embodiment 3.
Figure 4:
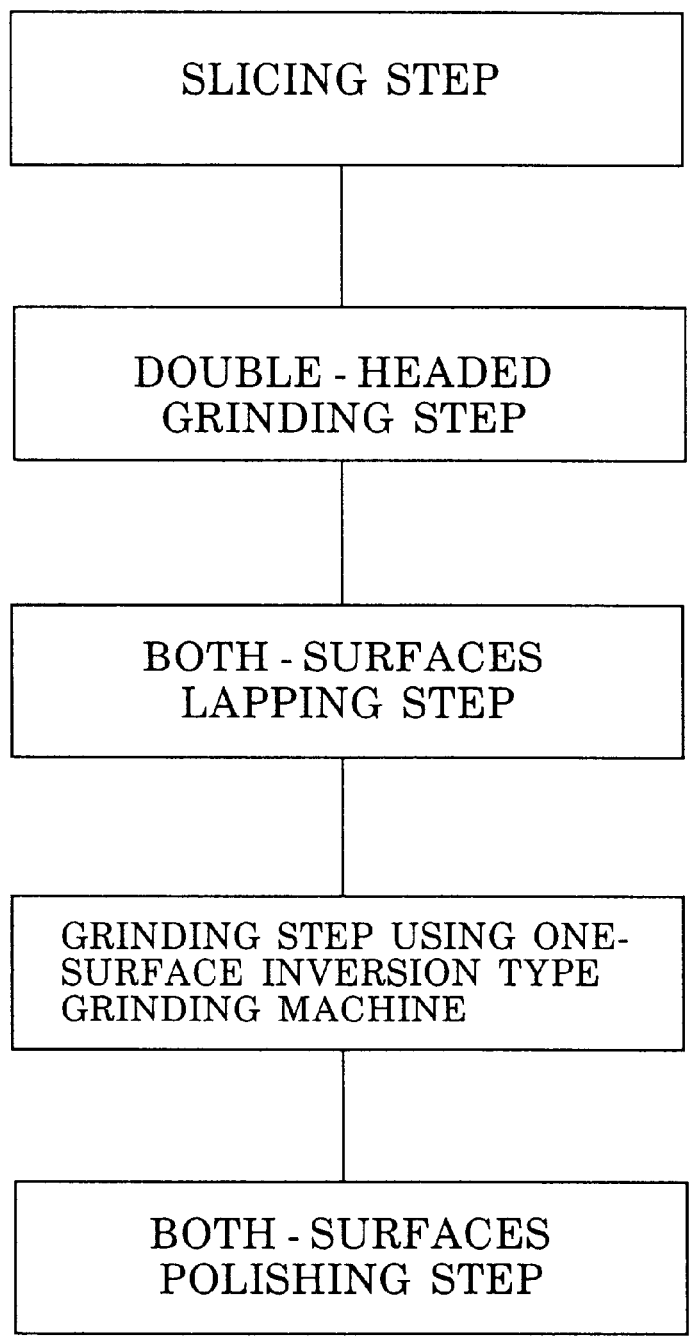
FIG. 4 is a flowchart showing processing steps used in Embodiment 4.
Figure 5:
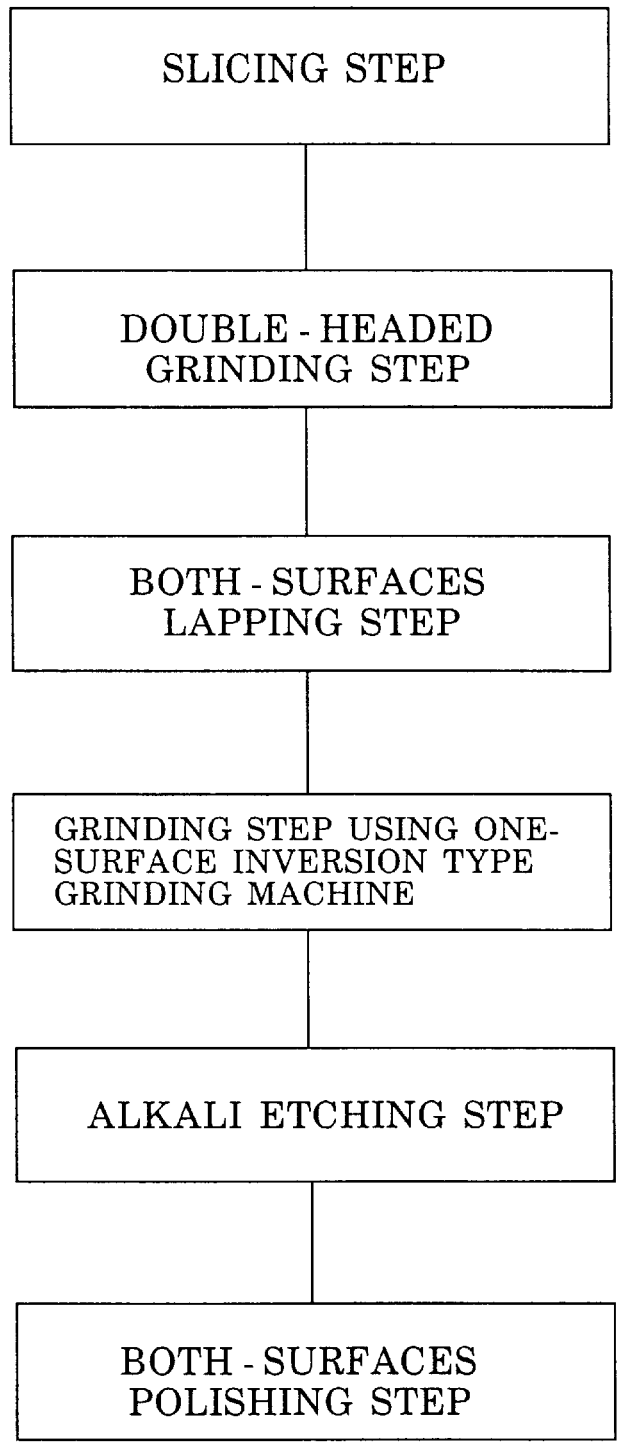
FIG. 5 is a flowchart showing processing steps used in Embodiment 5.

The present invention is characterized by using a double-headed grinding step, a both-surfaces lapping step and a both-surfaces polishing step. By processing a sliced wafer using a double-headed grinding machine, a strained layer formed on the wafer surface during slicing, a macroscopic undulation component with a height of a few mm and period of a few tens of mm, and a roughness component with a height of a few mm and period of a few mm are removed, and the flatness of the wafer is improved.

After this step, the wafer is subjected to both-surfaces lapping, and then washing to remove impurities such as slurry from the wafer surfaces. By processing the wafer using the both-surfaces lapping device, minute surface undulations with a height of a few tens of nm and period of a few mm that arose during the double-headed grinding are removed.

Moreover, chamfering may be carried out using a wafer periphery chamfering machine after the double-headed grinding, thus removing chips in the wafer periphery that arose during slicing step and the double-headed grinding step, and improving the accuracy of the wafer diameter and the peripheral shape.

In the double-headed grinding in the present invention, loose abrasive grains are not used but rather the both surfaces of the wafer are simultaneously ground using fixed abrasive grains, allowing the undulations that arose during slicing to be removed. The grain size of the grindstones can be from about #300 to about #10000. Moreover, a metal, vitrified or resin bond binder or the like can be used as the diamond binder.

The double-headed grinding machine used has a constitution in which a carrier capable of housing one or more wafers is positioned between grindstones that face one another. The grindstones are rotating at high speed by separate driving mechanisms, allowing the both surfaces of each sliced wafer held by the carrier, which is rotating at low speed, to be ground simultaneously (regardless of whether or not the wafer has been chamfered). Moreover, it is also possible to use, for example, a double-headed grinding device in which the wafers are not held by a carrier but rather are inserted between the grindstones one wafer at a time and the both surfaces of the wafer are simultaneously ground.

Regarding the processing conditions of the double-headed grinding machine, the gauge of the grindstones can be anywhere in the range of #300 to #10000.

If the gauge of the grindstones is made to be less than #300, then there is an improvement in the grinding efficiency, but there is an increase in the surface roughness and the processing-induced strained layer, and hence the amount of processing required in the lapping step increases, resulting in it being impossible to reduce the load in the lapping step, which is an object of the present invention. It is thus appropriate for the gauge of the grindstones of the double-headed grinding machine to be #300 or more.

The processing amount in double-headed grinding machine must be at least the value given by the following formula. Here, the wafer TTV value represents the unevenness in the thickness across the wafer surface.

Minimum grinding amount in the double-headed grinding machine=wafer TTV value+surface roughness×2

Regarding the periphery chamfering step, through a low strain chamfering step in which the edge of the wafer is finished to a high precision and low strain using fine fixed abrasive particles, a wafer having a uniform surface width can be manufactured, and moreover loss of shape of the cross section of the chamfered part upon contact with a carrier or the like can be prevented.

In the low strain chamfering step, a constitution can be adopted in which, for example, the wafer is held by vacuum suction, and a periphery grinding grindstone quickly rotating and notch grinding grindstone are arranged on the peripheral part of a rotating table quickly rotating, thus allowing low strain grinding to be carried out.

In the low strain chamfering step, by carrying out low strain grinding as described above, the depth of the processing-induced strained layer in the radial direction can be made to be 2 to 3 mm, and the edge can be finished to a better roughness, and as a result an extremely smooth edge can be produced only through a subsequent final polishing step for edge.

In the both-surfaces lapping step, a publicly known device and method can be used. Regarding the processing conditions, a slurry gauge of from #800 to #4000 can be used. Polishing is possible even with a slurry of gauge of #4000 or greater, but there will be a marked decrease in the polishing capability, resulting in a long time polishing. Moreover, there will be an improvement in the polishing efficiency if the slurry gauge is less than #800, but there will also be an increase in the surface roughness and the processing-induced strained layer, resulting in an increase of the amount of processing required in the next step.

The processing amount in the both-surfaces lapping step must be at least the value given by the following formula. Here, the wafer surface changed layer in quality by processing depth represents the depth of the strained layer and the surface roughness as observed using the angle lap evaluation method, and the wafer TTV value represents the unevenness in the thickness across the wafer surface. After lapping, washing is carried out to remove the slurry from the wafer surfaces.

Minimum polishing amount in both-surfaces lapping wafer surface changed layer in quality by processing depth×2 wafer TTV value The both-surfaces lapping step can also be carried out using a lapping device in which the processing surfaces of the platen are elastic bodies rather than metallic as in a publicly known device.

The both-surfaces polishing step is carried out for the purpose of removing a processing-induced strained layer that has arisen through the previous steps while maintaining the degree of flatness of the wafer flattened through the above-mentioned step. Polishing cloths made of an expanded urethane resin or the like are used, polishing slurry is fed in, and polishing is carried out while applying pressure. There are no particular limitations on the grain size of the polishing slurry.

As an example of the device used, for example, upper and lower platen having polishing pads are positioned facing one another, a sun gear is installed on the central side of the lower platen and an internal gear on the outside, and a toothed carrier is held between the two gears. By means of this setup, the carrier, which holds a plurality of wafers and is sandwiched between the polishing pads of the upper and lower platen, both rotates on and revolves around its own axis, and hence by applying pressure to the upper platen both surfaces of each wafer can be polished.

In the chemical etching step, etching is carried out using an etching solution after the both-surfaces lapping step, thus removing processing-induced strain from the wafer surfaces and the chamfered part. The wafer is etched using an etching solution containing hydrofluoric acid and nitric acid, thus removing strain from the wafer surfaces and the chamfered part. Moreover, the etching may also be carried out using a solution containing potassium hydroxide or sodium hydroxide in place of the mixed acid.

After etching, both surfaces of the wafer are simultaneously polished using a both-surfaces polishing device. Because strain caused by lapping is removed by etching before the both-surfaces polishing, the processing amount for the both-surfaces polishing need merely be such as to make the etched surfaces into mirror-finished surfaces.

In the grinding step using a single side grinding machine of inversion type, grinding of the wafer surfaces is carried out, thus removing processing-induced strain in the wafer surfaces that arose during lapping. The grindstone used in single side grinding machine of inversion type preferably has an abrasive grain gauge of at least #1500. The amount of grinding per surface should be sufficient to remove unevenness in thickness and residual strain from the previous processing, with the minimum amount being given by the following formula.

Minimum grinding amount of single side grinding machine of inversion type=wafer surface changed layer in quality by processing depth+wafer TTV value After both surfaces have been ground using the single side grinding machine of inversion type, the both surfaces are polished simultaneously using a both-surfaces polishing device. Strain has been reduced using the single side grinding machine of inversion type before the both-surfaces polishing, and hence the processing amount for the both-surfaces polishing need merely be such as to remove strain arising through the one-surface grinding and produce mirror-finished surfaces.

Moreover, after grinding of both surfaces has been carried out using the single side grinding machine of inversion type, strain arising through the grinding may be removed using an etching solution (a mixed acid of hydrofluoric acid and nitric acid, a solution of potassium hydroxide or sodium hydroxide, or the like). The amount of etching with the etching solution should be sufficient to remove the strain that has arisen through the grinding.

After the etching, the both surfaces are simultaneously polished using a both-surfaces polishing device. Strain arising through the single side grinding machine of inversion type has been removed by etching before the both-surfaces polishing, and hence the processing amount for the both-surfaces polishing need merely be such as to make the wafer surfaces into mirror-finished surfaces.

Moreover, before and after the both-surfaces polishing step, the peripheral chamfered part and notched part may be mirror-finished using a publicly known method and device as required.

EMBODIMENTS

Embodiment 1

A monocrystalline silicon ingot pulled using the CZ method was cut using a wire saw to obtain a wafer with a diameter of 200 mm or 300 mm. Regarding the accuracy of the sliced wafer, the TTV was 5 to 20 mm, and a macroscopic surface undulation component (height of 5 to 10 mm, period of 1 mm or more) and a surface roughness component (height of 0.5 to 5 mm, period of no more than 1 mm) arose.

Double-headed grinding was carried out using grindstones with a gauge of #300 or more and a processing amount of at least 'wafer TTV value+surface roughness×2'. As a result, a wafer having the removed macroscopic surface undulation component and the surface roughness component and a good TTV value was obtained.

Minute undulations (height of 10 to 100 nm, period of 1 to 10 mm) had arisen on the surfaces of the wafer processed using the double-headed grinding machine. Lapping was thus carried out on both surfaces of the wafer simultaneously using a both-surfaces lapping device to remove the minute surface undulations. A slurry gauge of #800 to #4000 was used for the both-surfaces lapping, and the processing amount was at least 'depth of processing-changed layer in quality by processing layer caused by the double-headed grinding×2+TTV value', i.e. at least about 10 mm. As a result, a wafer with the minute surface undulations removed was obtained.

Note that even if the processing amount for the both-surfaces lapping is increased, there is no reduction in the performance of removing the minute surface undulations.

Washing was carried out after lapping, and then the both surfaces were polished simultaneously using a both-surfaces polishing device. In the both-surfaces polishing, polyurethane polishing cloths and a polishing liquid having colloidal silica as a principal component were used, and mirror polishing was carried out.

COMPARATIVE EXAMPLE 1

A monocrystalline silicon ingot pulled using the CZ method was cut using a wire saw to obtain a wafer with a diameter of 200 mm or 300 mm. Regarding the accuracy of the sliced wafer, the TTV was 5 to 20 mm, and a macroscopic surface undulation component (height of 5 to 10 mm, period of 1 mm or more) and a surface roughness component (height of 0.5 to 5 mm, period of no more than 1 mm) arose.

Lapping was next carried out on both surfaces of the wafer simultaneously using a both-surfaces lapping device, thus improving the TTV value while removing the macroscopic surface undulation component. A slurry gauge of #800 to #4000 was used for the both-surfaces lapping, and the processing amount was at least 'TTV value+surface roughness×2', i.e. at least about 80 mm for each surface.

Washing was carried out after lapping, and then the both surfaces were polished simultaneously using a both-surfaces polishing device. In the both-surfaces polishing, polyurethane polishing cloths and a polishing liquid having colloidal silica as a principal component were used, and mirror polishing was carried out.

Embodiment 2

A monocrystalline silicon wafer for which slicing and double-headed grinding had been completed as in Embodiment 1 was subjected to chamfering using a low strain chamfering machine. Lapping and both-surfaces polishing were then carried out as in Embodiment 1. Moreover, the chamfered part was also mirror polished using polyurethane polishing cloths and a polishing liquid having colloidal silica as a principal component.

Embodiment 3

A monocrystalline silicon wafer for which slicing, double-headed grinding and lapping had been completed as in Embodiment 1 was subjected to etching using an etching solution containing hydrofluoric acid and nitric acid, thus removing processing-induced strain from the wafer surfaces and the chamfered part.

Mirror polishing was then carried out as in Embodiment 1 using a both-surfaces polishing device with polyurethane polishing cloths and a polishing liquid having a colloidal silica component.

Embodiment 4

A monocrystalline silicon wafer for which slicing; double-headed grinding and lapping had been completed as in Embodiment 1 was subjected to grinding using a single side grinding machine of inversion type, thus removing processing-induced strain from the wafer surfaces that had arisen through the lapping.

Mirror polishing was then carried out as in Embodiment 1 using a both-surfaces polishing device with polyurethane polishing cloths and a polishing liquid having a colloidal silica component.

Embodiment 5

A monocrystalline silicon wafer for which slicing, double-headed grinding and lapping had been completed as in Embodiment 1 was subjected to grinding using a single side grinding machine of inversion type, thus removing processing-induced strain from the wafer surfaces that had arisen through lapping.

After grinding both surfaces using the single side grinding machine of inversion type, alkali etching was carried out using a potassium hydroxide solution, thus removing strain caused by the single side grinding machine of inversion type.

Mirror polishing was then carried out as in Embodiment 1 using a both-surfaces polishing device with polyurethane polishing cloths and a polishing liquid having a colloidal silica component.

Embodiment 6

In the lapping step in each of Embodiments 1 to 5, a lapping device having elastic bodies as the processing surfaces of the platen was used. Because the processing surfaces holding the lapping abrasive grains were elastic bodies, the abrasive grains acted softly on the wafer surfaces. As a result, wafer surfaces having less processing-induced strain than when metal processing surfaces are used could be obtained, allowing the processing amount in the next step to be reduced. Note that there was no impairment of the effect of removing the minute surface undulations arising through the double-headed grinding, which is a characteristic feature of the present invention.

A resin such as a polyurethane resin, a PVC resin or a vinyl chloride resin or a nonwoven cloth or the like can be used as the elastic bodies, with it being possible to obtain similar effects in all cases.

The minimum processing amount in each of the processing steps in each of Embodiments 1 to 6 is the minimum that will allow the residual stress from the previous processing step to be removed and the TTV to be corrected. However, even if more processing than this is carried out, the effects of the present invention will not be impaired.

Moreover, note that in the Embodiments, a both-surfaces polishing device was used in the mirror polishing step, but similar effects can be obtained by carrying out mirror polishing using a one-surface polishing device. Moreover, similar effects can be obtained even if the present invention is applied to manufacturing of a wafer for which only one of the surfaces is polished.

What is claimed is:

1. A method of manufacturing a semiconductor wafer comprising, following a slicing step to provide a wafer,
   a double-sided grinding step;
   a both-surfaces lapping step including utilization of a surface plate with a processing surface made of an elastic body, and wherein a minimum processing amount=wafer surface changed layer processing depth×2+wafer TTV value; and a both-surfaces polishing step.

* * * * *